(12) United States Patent
Bergen et al.

(10) Patent No.: US 11,187,594 B2
(45) Date of Patent: *Nov. 30, 2021

(54) BONDED ASSEMBLY WITH INTEGRATED TEMPERATURE SENSING IN BOND LAYER

(71) Applicant: Watlow Electric Manufacturing Company, St. Louis, MO (US)

(72) Inventors: John Patrick Bergen, San Jose, CA (US); Daryl G. James, Coquitlam (CA)

(73) Assignee: WATLOW ELECTRIC MANUFACTURING COMPANY, St. Louis, MO (US)

( * ) Notice: Subject to any disclaimer, the term of this patent is extended or adjusted under 35 U.S.C. 154(b) by 292 days.

This patent is subject to a terminal disclaimer.

(21) Appl. No.: 16/294,502

(22) Filed: Mar. 6, 2019

(65) Prior Publication Data

US 2019/0204165 A1 Jul. 4, 2019

Related U.S. Application Data

(63) Continuation of application No. 14/792,807, filed on Jul. 7, 2015.

(Continued)

(51) Int. Cl.
*H05B 3/68* (2006.01)
*G01K 11/32* (2021.01)
(Continued)

(52) U.S. Cl.
CPC ........ *G01K 11/32* (2013.01); *H01L 21/67103* (2013.01); *H01L 21/67248* (2013.01); *H01L 21/6831* (2013.01); *H02N 13/00* (2013.01)

(58) Field of Classification Search
CPC .............. G01K 11/32; H01L 21/67103; H01L 21/67248; H01L 21/6831; H02N 13/00
(Continued)

(56) References Cited

U.S. PATENT DOCUMENTS 5,775,808 A 7/1998 Pan
6,481,886 B1 * 11/2002 Narendrnath ...... G01K 11/3213
250/458.1

(Continued)

FOREIGN PATENT DOCUMENTS

CN 202192864 4/2012
JP H06170670 6/1994
(Continued)

OTHER PUBLICATIONS

English translation of CN202192864, Genming Gu (Year: 2012).*

*Primary Examiner* — Sang Y Paik
(74) *Attorney, Agent, or Firm* — Burris Law, PLLC

(57) ABSTRACT

An assembly, for example an electrostatic chuck assembly, includes a first member, a second member disposed proximate the first member, a bond layer disposed between the first member and the second member, and at least one optical sensor disposed proximate the bond layer to detect a temperature of the bond layer in a field of view of the at least one optical sensor. The bond layer includes a phosphorescent material and provides a dual function of bonding the second member to the first member and emitting phosphorescent radiation towards the at least one optical sensor. In one form, the first member is an electrostatic chuck member and the second member is a heating plate. The assembly may further include a cooling plate and an additional bond layer disposed between the heating plate and the cooling plate.

20 Claims, 4 Drawing Sheets

Related U.S. Application Data

(60) Provisional application No. 62/021,937, filed on Jul. 8, 2014.

(51) Int. Cl.
*H01L 21/683* (2006.01)
*H01L 21/67* (2006.01)
*H02N 13/00* (2006.01)

(58) Field of Classification Search
USPC .............................. 219/443.1–444.1, 542–548
See application file for complete search history.

(56) References Cited

U.S. PATENT DOCUMENTS

| | | | |
|---|---|---|---|
| 9,371,148 B1 | 6/2016 | Schwendimann et al. | |
| 2001/0054601 A1* | 12/2001 | Ding | H01J 37/321 |
| | | | 216/68 |
| 2011/0297082 A1 | 12/2011 | Watanabe et al. | |

FOREIGN PATENT DOCUMENTS

| | | | |
|---|---|---|---|
| JP | H1048063 | | 2/1998 |
| JP | 2002520587 | | 7/2002 |
| JP | 2005159018 | | 6/2005 |
| JP | 2011009351 | | 1/2011 |
| JP | 2013074251 | * | 4/2013 |

* cited by examiner

BONDED ASSEMBLY WITH INTEGRATED TEMPERATURE SENSING IN BOND LAYER

CROSS-REFERENCE TO RELATED APPLICATIONS

This application is a continuation of U.S. application Ser. No. 14/792,807, filed on Jul. 7, 2015, which claims priority to and the benefit of U.S. Provisional Application No. 62/021,937, filed on Jul. 8, 2014. The contents of the above applications are incorporated herein by reference.

FIELD

The present disclosure relates generally to heated assemblies, and more particularly to temperature detection and control systems for such assemblies, including by way of example, electrostatic chucks and substrates in semiconductor processing equipment.

BACKGROUND

The statements in this section merely provide background information related to the present disclosure and may not constitute prior art.

Heated assemblies are frequently used in applications having limited space and requiring precise control. In the art of semiconductor processing, for example, a chuck or susceptor is used to hold a substrate (or wafer) and to provide a uniform temperature profile to the substrate during processing.

Referring to FIG. 1, a prior art support assembly 110 for an electrostatic chuck is illustrated, which includes an electrostatic chuck 112 with an embedded electrode 114, and a heating plate 116 that is bonded to the electrostatic chuck 112 through an adhesive layer 118. A heater 120 is secured to the heating plate 116, which may be an etched-foil heater, by way of example. This heater assembly is bonded to a cooling plate 122, again through an adhesive layer 124. The substrate 126 is disposed on the electrostatic chuck 112, and the electrode 114 is connected to a current source (not shown) such that electrostatic power is generated, which holds the substrate 126 in place. A radio frequency (RF) power source (not shown) is connected to the electrostatic chuck 112, and a chamber that surrounds the support assembly 110 is connected to ground. The heater 120 thus provides requisite heat to the substrate 126 when a material is deposited or a thin film on the substrate 126 is etched. The heater 120 thus provides requisite heat to the substrate 126 when a material is deposited onto or etched from the substrate 126.

During processing of the substrate 126, it is important that the temperature profile of the electrostatic chuck 112 be highly uniform in order to reduce variations within the substrate 126 being etched. Improved devices and methods for improving temperature uniformity are continually desired in the art of semiconductor processing, among other applications.

SUMMARY

The present disclosure provides a holding clamp with improved means of confirming that an attachment to a motor vehicle undercarriage has been correctly made.

In one form of the present disclosure an assembly is provided that includes a first member, a second member disposed proximate the first member, a bond layer disposed between the first member and the second member, and at least one optical sensor disposed proximate the bond layer to detect a temperature of the bond layer in a field of view of the at least one optical sensor. The bond layer includes a phosphorescent material and provides a dual function of bonding the second member to the first member and emitting phosphorescent radiation towards the at least one optical sensor.

In another form, the assembly further includes at least one heating element embedded within the second member or secured to the second member. In this form, the assembly may include a controller that is configured to control the at least one heating element via receiving and processing signals from the at least one optical sensor to determine temperature in the bond layer according to a decay rate of the phosphorescent material.

In another form, the assembly further includes a tuning layer disposed proximate the second member.

In a further form, the at least one optical sensor is arranged to observe a lower side of the bond layer.

In still another form, the assembly further includes an aperture extending through the second member and the at least one optical sensor is disposed within the aperture. In this form, the phosphorescent material may be aligned with the aperture.

In other various forms, the phosphorescent material may include a phosphorescent powder mixed into at least a portion of the bond layer, at least a portion of the at least one optical sensor may be embedded in the bond layer, and/or the bond layer may include a silicone elastomer, a ceramic epoxy, or a pressure sensitive adhesive. The bond layer may comprise a composition, by percent weight of, approximately 75% to approximately 99% silicone and approximately 1% to approximately 25% phosphorescent powder. The optical sensor may comprise an optical fiber.

In another form of the present disclosure, an electrostatic chuck support assembly is provided that includes an electrostatic chuck, a heating plate disposed proximate the electrostatic chuck, a first bond layer disposed between the electrostatic chuck and the heating plate, a first optical sensor positioned to observe a portion of the first bond layer comprised of phosphorescent material, a cooling plate disposed proximate the heating plate, and a second bond layer disposed between the heating plate and the cooling plate. The first bond layer provides a dual function of bonding the heating plate to the electrostatic chuck and emitting phosphorescent radiation towards the at least one optical sensor.

In one form, the assembly further includes a controller configured to receive and process signals from the first optical sensor to determine temperature in the first bond layer according to a decay rate of the phosphorescent material and control at least one heating element that is embedded within or secured to the heating plate as a function of the received and processed signals.

In another form, at least a portion of the second bond layer comprises a phosphorescent material and a second optical sensor is positioned to illuminate and observe the portion of the second bond layer comprised of phosphorescent material. In this form, the electrostatic chuck support assembly may further include a controller, wherein the controller receives and processes signals from the first optical sensor to determine temperature in the first bond layer according to a decay rate of the phosphorescent material in the first bond layer and controls at least one heating element that is embedded within or secured to the heating plate as a function of the received and processed signals from the first optical sensor. The controller may also receive and process signals from the second optical sensor to determine temperature in the second bond layer according to a decay rate of the phosphorescent material in the second bond layer and control at least one cooling element of the cooling plate as a function of the received and processed signals from the second optical sensor.

In a further form, electrostatic chuck support assembly further comprises a tuning layer disposed proximate the heating plate.

In a further form, the entire first bond layer comprises the phosphorescent material.

In yet another form, the first bond layer comprises a composition, by percent weight of, approximately 75% to approximately 99% silicone and approximately 1% to approximately 25% phosphorescent powder.

In another form of the present disclosure, an electrostatic chuck support assembly is provided that includes an electrostatic chuck, a heating plate disposed proximate the electrostatic chuck, and a bond layer disposed between the electrostatic chuck and the heating plate, wherein at least a portion of the bond layer comprises a phosphorescent material and provides a dual function of bonding the heating plate to the electrostatic chuck and emitting phosphorescent radiation. The electrostatic chuck support assembly further includes an optical sensor positioned to observe the portion of the bond layer comprised of phosphorescent material, a cooling plate disposed proximate the heating plate, and a controller configured to receive and process signals from the optical sensor to determine temperature in the bond layer according to a decay rate of the phosphorescent material and control at least one heating element that is embedded within or secured to the heating plate as a function of the received and processed signals from the optical sensor.

Further areas of applicability will become apparent from the description provided herein. It should be understood that the description and specific examples are intended for purposes of illustration only and are not intended to limit the scope of the present disclosure.

DRAWINGS

In order that the disclosure may be well understood, there will now be described various forms thereof, given by way of example, reference being made to the accompanying drawings, in which.

Figure 1:
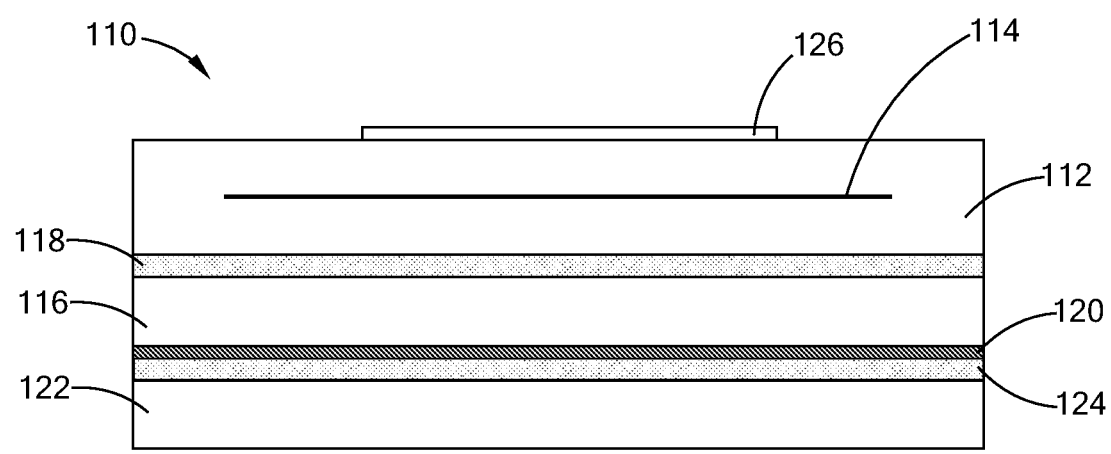
FIG. 1 is an elevated side view of a prior art electrostatic chuck.

The drawings described herein are for illustration purposes only and are not intended to limit the scope of the present disclosure in any way.

DETAILED DESCRIPTION

The following description is merely exemplary in nature and is not intended to limit the present disclosure, application, or uses. It should be understood that throughout the drawings, corresponding reference numerals indicate like or corresponding parts and features.

Generally, with fiber optic sensing, a light source is used to illuminate a phosphorescent material for a brief time period, and an optical signal conditioner is used to detect the light radiation that the phosphorescent material emits in response. The rate of decay of phosphorescent radiation is proportional to its temperature, and thus the temperature of the object can be determined. Such fiber optic sensing is set forth in greater detail in, for example, in U.S. Pat. Nos. 4,652,143 and 4,776,827, which are hereby incorporated by reference in their entireties.

As used herein, the term "optical sensor" should be construed to mean both a fiber optic light guide and an optical signal conditioner used to sense and determine temperature of a phosphorescent material.

Figure 2:
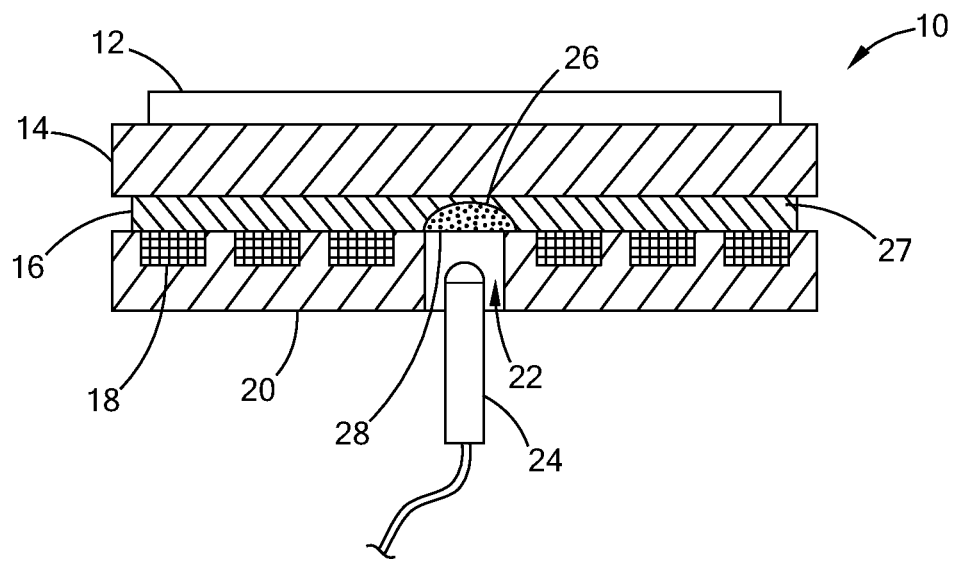
FIG. 2 is a cross-sectional side view of an assembly, showing a substrate, electrostatic chuck, bond layer, heating plate, and an optical sensor constructed in accordance with the principles of the present disclosure.

Referring to FIG. 2, an assembly 10 is shown comprising a substrate 12, an electrostatic chuck 14, a heating plate 20 and a bond layer 16 disposed between the electrostatic chuck 14 and the heating plate 20. The bond layer 16 secures heating plate 20 to the electrostatic chuck 14 and comprises a phosphorescent material 26 disposed within an optically clear matrix 27. The matrix 27 may be the actual bond material, such as a silicone bonding material. Alternatively, the phosphorescent material 26 may be mixed with the matrix 27, and then this composite material combined with the bond layer 16 material. Additionally, the phosphorescent material 26, with or without a matrix 27 that is separate from the bond layer 16, may be mixed evenly throughout the entire bond layer 16, or it may be located only specific areas throughout the bond layer 16. Accordingly, the specific illustrations shown herein should not be construed as limiting the scope of the present disclosure.

In one form, the heating plate 20 also defines an aperture 22 exposing the phosphorescent portion of the lower side 28 of the bond layer 16 to an optical sensor 24, disposed within the aperture 22. In operation, the optical sensor 24 illuminates the phosphorescent material 26 and then receives light from the decay of the phosphorescent material 26 to determine the temperature of the bond layer 16, which is thermally coupled to the electrostatic chuck 14 and the substrate 12 by conduction. This information is sent to a controller 54, which determines and controls the temperature of the electrostatic chuck 14 and substrate 12.

The heating plate 20 provides support for the electrostatic chuck 14. It also may contain one or more heating elements 18 which may be used to alter the temperature of the electrostatic chuck 14. The heating plate 20 may be made of metal or another thermally conductive material.

The bond layer 16 secures the heating plate 20 to the electrostatic chuck 14. It may be made from a number of substances such as a silicone elastomer, a pressure sensitive adhesive, a glass frit, a ceramic epoxy, or a layer of indium. The bond layer 16 should be capable of effectively securing the heating plate 20 and the electrostatic chuck 14 throughout the operational temperature range of the assembly 10, as well as being capable of incorporating a phosphorescent material 26 prior to application. The bond layer 16 may also be made of a transparent, thermally conductive, elastomeric material such as Sylgard® 184 brand silicone compound manufactured by Dow Corning. Adhesion may be improved with the addition of a primer to the mating surfaces. Various optically transparent silicone elastomers may be used depending on the requirements for bond strength, temperature range, thermal conductivity, viscosity, durometer, cure-time, and bond layer 16 thickness.

The phosphorescent material 26 is mixed into the bond layer 16, and should be capable retaining its phosphorescent properties after mixing. The phosphorescent material 26 may be more easily mixed into the bond layer 16 if it is made of a small particle size powder, which may be between about 1 to about 100 microns in size. The mix ratio of the bond layer 16 material to the phosphorescent material 26 is dependent on application requirements. Higher signal strength may be obtained from a higher concentration of phosphorescent material, such as approximately 25% by weight. Alternatively, improved bond strength and elasticity may be achieved with a lower concentration ratio of phosphorescent material, such as approximately 1% by weight.

The phosphorescent material 26 is generally an inorganic phosphor that can be excited by conventional LED sources. Examples of suitable phosphorescent materials 26 include, by way of example, $Al_2O_3:Cr^{3+}$, $Mg_{28}Ge_{10}O_{48}:Mn^{4+}$, or $Mg_4FGeO_6:Mn^{4+}$. These specific compounds are merely exemplary and should not be construed as limiting the range of compounds that may be used as the phosphorescent material 26. Generally, in this application, the compounds that may be employed will exhibit absorption bands between about 380 nm to about 650 nm, and excitation bands between about 500 nm and about 950 nm with strong time decay dependence on temperature over the required temperature range of the application. Materials selected with shorter decay time constants at a given temperature may enable faster update rates. Various other materials may be employed, and may be selected based on their application suitability for temperature range, phosphorescent decay rate, cost, and commercial availability.

The process of mixing the phosphorescent material 26 into the bond layer 16 is dependent on whether the phosphorescent material 26 will be disposed only in a portion of the bond layer 16 or the entirety of the bond layer 16. If the phosphorescent material 26 will be mixed into the entirety of the bond layer 16, the phosphorescent powder can be added as the bond layer 16 material is mixed. However, if the phosphorescent material 26 will be disposed only on a portion of the bond layer 16 material, it may be desirable to apply the bond layer 16 material to either the heating plate 20 or the electrostatic chuck 14 first. Then, the phosphorescent material 26 may be mixed into the bond layer 16 where it will align with the optical sensor 24, such as aligning with the aperture 22 of the heating plate 20. Optionally, the phosphorescent material 26 can be mixed into the bond layer 16 in specific locations after the entire bond layer 16 has been applied.

Figure 3:
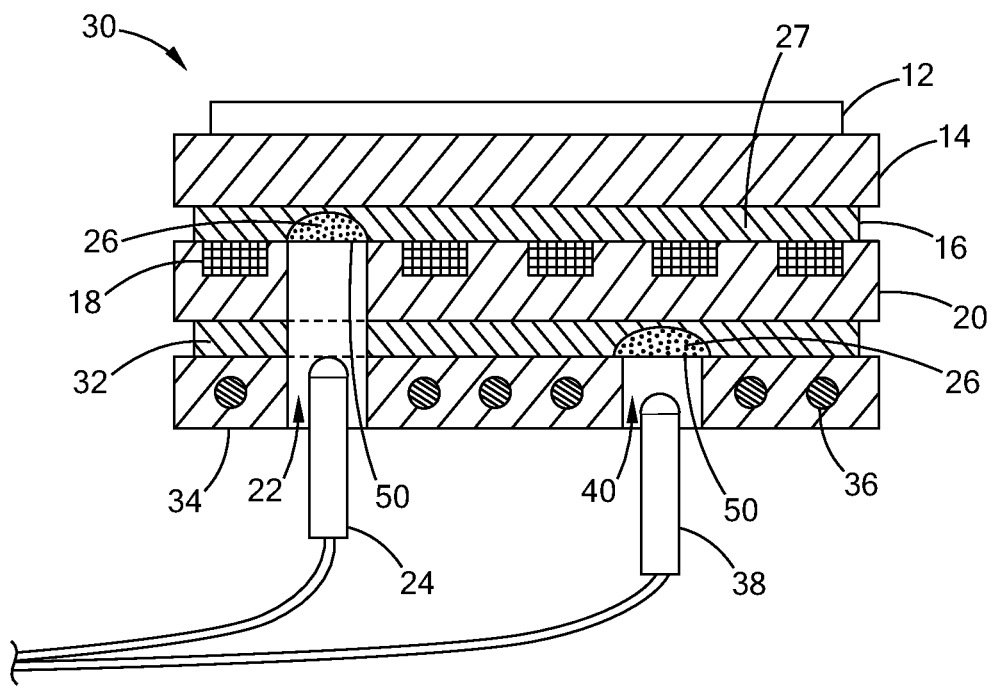
FIG. 3 is a cross-sectional side view of another form of an assembly, showing a substrate, electrostatic chuck, a heating plate, a cooling plate, two bond layers, and two optical sensors constructed in accordance with the principles of the present disclosure.

With reference to FIG. 3, a cross-section of another possible form of the assembly 30 is shown. Similar to the form of FIG. 2, this form includes a substrate 12, an electrostatic chuck 14, a heating plate 20 with heating elements 18 and an aperture 22 allowing disposition of an optical sensor 24, and a first bond layer 16 between the heating plate 20 and the electrostatic chuck 14 comprising the phosphorescent material 26. However, FIG. 3 shows an additional cooling plate 34 with cooling elements 36. Between the heating plate 20 and the cooling plate 34 may be a second bond layer 32.

The cooling plate 34 transfers heat from the heating plate 20 and the electrostatic chuck 14 to the cooling plate 34. The cooling plate 34 may be made of a metal or another material which efficiently conducts heat. The cooling elements 36 of the cooling plate 34 may comprise fluid passage to provide convective heat transfer. The cooling plate 34 may also define first and second apertures 22, 40. The first aperture 22 of the cooling plate 34 may be aligned with the aperture 22 defined by the heating plate 20 to allow an optical sensor 24 to be disposed in the aperture 22 to observe the first bond layer 16. The second aperture 40 may be aligned with phosphorescent portion of the lower side 50 of the second bond layer which comprises a phosphorescent material 26.

A second optical sensor 38 may be disposed in the second aperture 40 to illuminate and observe the decay rate of the phosphorescent material 26. This information may be used to model the thermal gradients across the two bond layers 16, 32 and more accurately control the rate of heating or cooling of the electrostatic chuck 14 and heating plate 20. The second optical sensor 38, or further additional optical sensors (not shown) may be employed for additional accuracy or redundancy as needed. It should also be understood that the optical sensors 24 and 38 in this form of the present disclosure need not be disposed within apertures 22, 40 as shown, which are merely exemplary and should not be construed as limiting the configuration of the optical sensors with respect to the bond layers having phosphorescent material.

The second bond layer 32 may be made of a similar range of materials as the first bond layer 16. Likewise, the range of phosphorescent material 26 which may be mixed into a portion of the second bond layer 32 may be similar to the first bond layer 16.

Additionally, the assembly 30 may comprise an additional tuning layer (not shown) to achieve high precision control over the temperature of the substrate 12. This tuning layer may comprise additional heating elements used to finely tune the heat distribution of the substrate 14 in addition to the heating elements 18 of the heating plate 20. Details on the composition, function, and integration of such a tuning layer may be found by way of example in U.S. Patent Publication 2013/0161305 and its related family of applications, which are commonly owned with the present application and the entire contents of which are incorporated herein by reference in their entirety.

Figure 4:
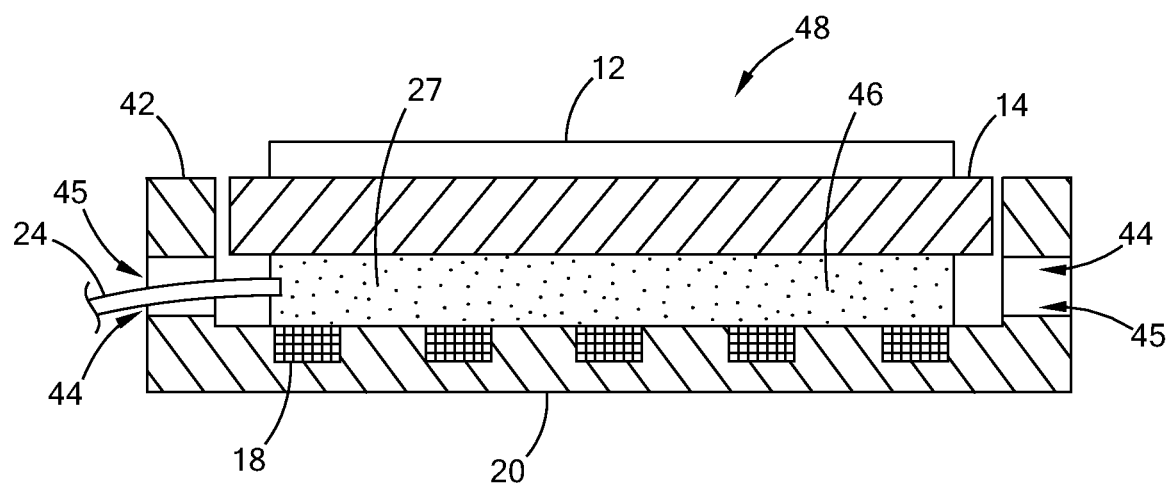
FIG. 4 is a cross-sectional side view of yet another form of an assembly, showing a substrate, electrostatic chuck, bond layer, and a heating plate with an aperture disposed on the side of the assembly constructed in accordance with the principles of the present disclosure.

With reference to FIG. 4, a cross-section of yet another form of the assembly 48 is shown. Similar to FIG. 2, this form includes a substrate 12, an electrostatic chuck 14, a heating plate 20 with heating elements 18, and a bond layer 16. However, the form shown in FIG. 4 has a heating plate 20 which defines an aperture 44 on the side of the assembly. An optical sensor 24 may be disposed within this aperture to observe the profile of the bond layer 16. Although only a portion of the bond layer 16 may contain phosphorescent material 26, at least a portion of the periphery of the bond layer 16 of FIG. 4 comprises a phosphorescent material 26. This allows the optical sensor 24 to be positioned anywhere around the circumference of or embedded within the bond layer 46 to observe the bond layer 46 and measure the temperature of the electrostatic chuck 14 in that region. In an additional form, the optical sensor 24 itself may be embedded within the bond layer 16 rather than remaining physically outside the bond layer 16.

The heating plate 20 may define the aperture 44 on the side of the bond layer 46 in at least two ways. As shown in FIG. 4, the heating plate 20 may include a sidewall 42, which rises above the base of the heating plate 20 to enclose a portion of the electrostatic chuck 14. This sidewall 42 may be in segments arranged circumferentially about the base 20 or completely encircle the base of the heating plate 20. The aperture 44 of the heating plate 20 may be defined by an opening 45 in this sidewall 42 exposing the bond layer 46 in the space between the electrostatic chuck 14 and the base of the heating plate 20.

Alternatively, the optical sensor 24 may be disposed on the base of a heating plate 20 without a sidewall 42 to observe the profile of the bond layer 46. In such a configuration, the aperture 44 would be defined by the space between the electrostatic chuck 14 and the heating plate 20.

Figure 5:
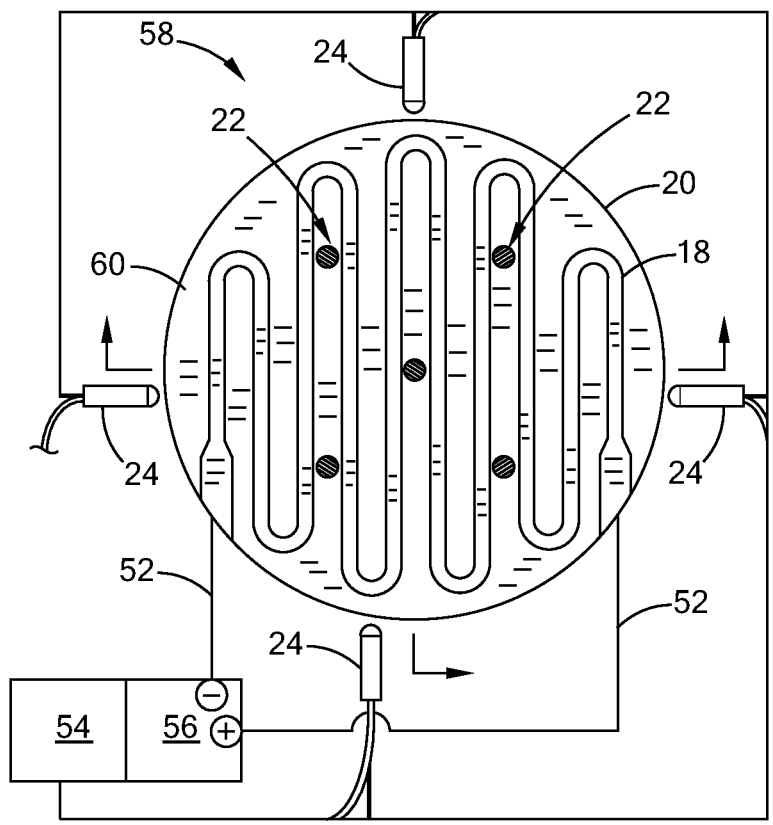
FIG. 5 is a partial plan view of another form of an assembly, showing a heating element and optical sensors constructed in accordance with the principles of the present disclosure.

Referring to FIG. 5, a partial plan view of the heating plate 20 for yet another form of the assembly 58 is shown. In this form, one possible configuration of a heating element 18 is shown. Additionally, numerous apertures 22 are shown in the heating plate 20 indicating positions where optical sensors 24 may be disposed. Further optical sensors 24 are shown around the circumference of the heating plate 20, as well as a controller 54 and a heating element power supply 56.

The heating elements 18 shown in FIG. 5 comprises a single resistive heating element 18, which may be arranged in evenly spaced traces to cover the surface of the heating plate 20. The ends of the resistive heating element 18 are connected by wires 52 to the power supply 56. Alternatively, the heating elements may be arranged as individual heating elements, which cover individual regions or zones of the heating plate's 20 surface 60. These heating elements may be connected to the power supply 56 by wires 52 in series or in parallel, or other circuit configurations. Additionally, a variety of arrangements of heating elements, in addition to different types of heaters such as layered, Kapton®, and ceramic, among others, may be employed while remaining within the scope of the present disclosure and thus the specific illustrations and descriptions herein should be construed as limiting the scope of the present disclosure.

Multiple apertures 22 defined on the surface and around the circumference of the heating plate 20 allow flexibility and redundancy in measuring the temperature of electrostatic chuck 14. Each aperture 22 may be occupied by an array of optical sensors 24 to provide constant temperature monitoring of many portions of the electrostatic chuck 14. Alternatively, fewer optical sensors 22 may be inserted into or removed from any aperture to allow monitoring of specific areas of the electrostatic chuck 14 as needed.

Figure 6:
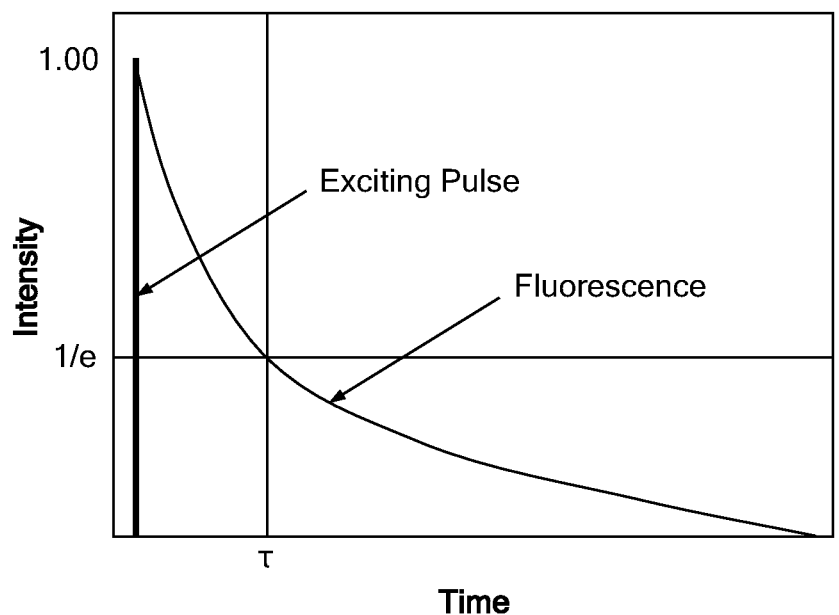
FIG. 6 is a chart showing an example of intensity of a phosphorescent material with respect to time.

Referring to FIG. 6, a chart is shown giving an example of how the optical sensor 24 measures the decay of the phosphorescent material 26 mixed into the bond layer 16. Initially, the optical sensor 24 excites the phosphorescent material 26 by illuminating it with a pulse of light. The phosphorescent material 26 then emits phosphorescent radiation with a determinable intensity which decays over a period of time. The optical sensor uses this intensity rate of decay to determine the time constant (τ) according to the formula $I_t = I_o e^{-kt/\tau}$, where I is intensity, t is time, and k is a constant value. The time (τ) constant of the phosphorescent radiation is dependent on the specific phosphorescent material 26.

The assembly 10 may be calibrated, along with the optical sensor(s) 24 and the controller 54 prior to use. As a result, the controller 54 can receive the information regarding the time constant of decay of the phosphorescent material 26 and determine the temperature of the bond layer 16 at the various optical sensor locations.

Figure 7:
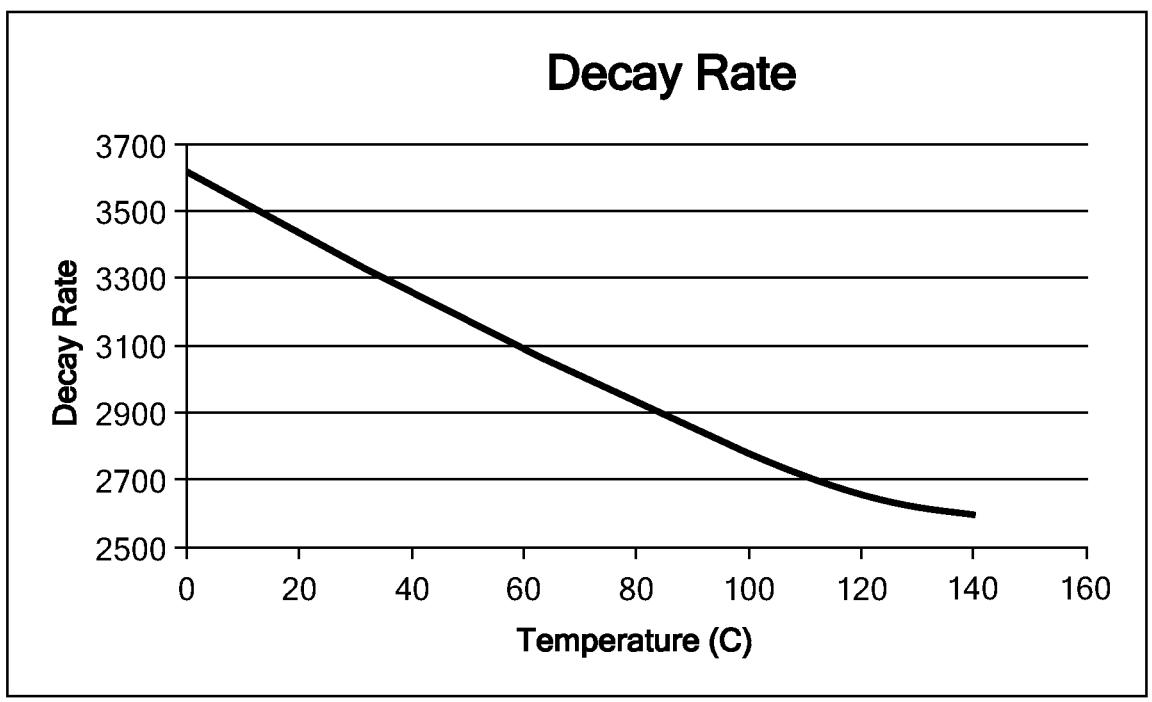
FIG. 7 is a chart showing an example of the calibration data used by a controller correlating decay rate to temperature of the electrostatic chuck.

Referring to FIG. 7, a chart is shown giving an example of data that may be used to calibrate the controller 54 for the assembly 10. The controller 54 may be configured to associate decay rate of the phosphorescent material 26 to temperature of the electrostatic chuck 14 or of the substrate 12. As discussed above, the temperature of the bond layer 16 may be determined by observing the decay rate of the phosphorescent material 26 in the bond layer 16. Through experimental use or thermodynamic modeling, the temperature in the electrostatic chuck 14 can be predicted from the temperature in the bond layer 16. Therefore, the controller 54 can be calibrated to associate a range of decay rates to a correlating range of electrostatic chuck 14 temperatures. A similar process may be used to predict the temperature in the substrate 12 if desired. As the controller 54 determines the temperature of the electrostatic chuck 14, the controller 54 may alter the power supply 56 to change the output of the heating elements 18 and adjust the temperature of the electrostatic chuck 14 as needed.

The present disclosure is merely exemplary in nature and, thus, variations that do not depart from the gist of the disclosure are intended to be within the scope of the present disclosure. For example, the composite bond layer (i.e., having the bond material and the phosphorescent material, with or without a separate binder) may be employed between any members of an assembly where temperature detection is desired, and whether or not those members function as heating members, cooling members, combinations thereof, or other functional members. Such variations are not to be regarded as a departure from the spirit and scope of the present disclosure.

What is claimed is:

1. An assembly comprising:
a first member;
a second member disposed proximate the first member;
a bond layer disposed between the first member and the second member, the bond layer comprising a phosphorescent material; and
at least one optical sensor disposed proximate the bond layer to detect a temperature of the bond layer in a field of view of the at least one optical sensor,
wherein the bond layer provides a dual function of bonding the second member to the first member and emitting phosphorescent radiation towards the at least one optical sensor for temperature measurement after the second member is secured to the first member.

2. The assembly according to claim 1 further comprising at least one heating element embedded within the second member or secured to the second member.

3. The assembly according to claim 2 further comprising a controller configured to control the at least one heating element via receiving and processing signals from the at least one optical sensor to determine temperature in the bond layer according to a decay rate of the phosphorescent material.

4. The assembly according to claim 1 further comprising a tuning layer disposed proximate the second member.

5. The assembly according to claim 1, wherein the at least one optical sensor is arranged to observe a lower side of the bond layer.

6. The assembly according to claim 1 further comprising an aperture extending through the second member, wherein the at least one optical sensor is disposed within the aperture.

7. The assembly according to claim 6, wherein the phosphorescent material is aligned with the aperture.

8. The assembly according to claim 1, wherein the phosphorescent material comprises a phosphorescent powder mixed into at least a portion of the bond layer.

9. The assembly according to claim 1, wherein at least a portion of the at least one optical sensor is embedded in the bond layer.

10. The assembly according to claim 1, wherein the bond layer comprises a silicone elastomer, a ceramic epoxy, or a pressure sensitive adhesive.

11. The assembly according to claim 1, wherein the bond layer comprises a composition, by percent weight of:
approximately 75% to approximately 99% silicone; and
approximately 1% to approximately 25% phosphorescent powder.

12. The assembly according to claim 1, wherein the optical sensor comprises an optical fiber.

13. An electrostatic chuck support assembly comprising:
an electrostatic chuck;
a heating plate disposed proximate the electrostatic chuck;
a first bond layer disposed between the electrostatic chuck and the heating plate, wherein at least a portion of the first bond layer comprises a phosphorescent material;
a first optical sensor positioned to observe the portion of the first bond layer comprised of phosphorescent material;
a cooling plate disposed proximate the heating plate; and
a second bond layer disposed between the heating plate and the cooling plate,
wherein the first bond layer provides a dual function of bonding the heating plate to the electrostatic chuck and emitting phosphorescent radiation towards the at least one optical sensor.

14. The assembly according to claim 13 further comprising a controller configured to receive and process signals from the first optical sensor to determine temperature in the first bond layer according to a decay rate of the phosphorescent material and control at least one heating element that is embedded within or secured to the heating plate as a function of the received and processed signals.

15. The electrostatic chuck support assembly according to claim 13, wherein at least a portion of the second bond layer comprises a phosphorescent material and a second optical sensor is positioned to illuminate and observe the portion of the second bond layer comprised of phosphorescent material.

16. The electrostatic chuck support assembly according to claim 15 further comprising a controller, wherein the controller:
receives and processes signals from the first optical sensor to determine temperature in the first bond layer according to a decay rate of the phosphorescent material in the first bond layer and controls at least one heating element that is embedded within or secured to the heating plate as a function of the received and processed signals from the first optical sensor; and
receives and processes signals from the second optical sensor to determine temperature in the second bond layer according to a decay rate of the phosphorescent material in the second bond layer and controls at least one cooling element of the cooling plate as a function of the received and processed signals from the second optical sensor.

17. The electrostatic chuck support assembly according to claim 13 further comprising a tuning layer disposed proximate the heating plate.

18. The electrostatic chuck support assembly according to claim 13, wherein the entire first bond layer comprises the phosphorescent material.

19. The electrostatic chuck support assembly according to claim 13, wherein the first bond layer comprises a composition, by percent weight of:
approximately 75% to approximately 99% silicone; and
approximately 1% to approximately 25% phosphorescent powder.

20. An electrostatic chuck support assembly comprising:
an electrostatic chuck;
a heating plate disposed proximate the electrostatic chuck;
a bond layer disposed between the electrostatic chuck and the heating plate, wherein at least a portion of the bond layer comprises a phosphorescent material and provides a dual function of bonding the heating plate to the electrostatic chuck and emitting phosphorescent radiation;
an optical sensor positioned to observe the portion of the bond layer comprised of phosphorescent material;
a cooling plate disposed proximate the heating plate; and
a controller configured to receive and process signals from the optical sensor to determine temperature in the bond layer according to a decay rate of the phosphorescent material and control at least one heating element that is embedded within or secured to the heating plate as a function of the received and processed signals from the optical sensor.

* * * * *